(12) United States Patent
Spiel

(10) Patent No.: US 9,929,730 B2
(45) Date of Patent: Mar. 27, 2018

(54) EFFICIENTLY MANAGING MULTIPLE POWER SUPPLIES

(71) Applicant: Cisco Technology, Inc., San Jose, CA (US)

(72) Inventor: Seth Spiel, San Francisco, CA (US)

(73) Assignee: Cisco Technology, Inc., San Jose, CA (US)

( * ) Notice: Subject to any disclaimer, the term of this patent is extended or adjusted under 35 U.S.C. 154(b) by 430 days.

(21) Appl. No.: 14/644,742

(22) Filed: Mar. 11, 2015

(65) Prior Publication Data

US 2016/0164516 A1 Jun. 9, 2016

Related U.S. Application Data

(60) Provisional application No. 62/086,760, filed on Dec. 3, 2014.

(51) Int. Cl.
| | |
|---|---|
| *H03K 17/687* | (2006.01) |
| *H03K 17/74* | (2006.01) |
| *G06F 1/26* | (2006.01) |

(52) U.S. Cl.
CPC .......... *H03K 17/687* (2013.01); *G06F 1/263* (2013.01); *H03K 17/74* (2013.01)

(58) Field of Classification Search
CPC ...... H03K 17/687; H03K 17/74; G06F 1/263; G06F 1/26; H02J 1/10; H02J 9/061
USPC .................................... 307/104, 80, 75, 140
See application file for complete search history.

(56) References Cited

U.S. PATENT DOCUMENTS

| | | | | | |
|---|---|---|---|---|---|
| 4,812,672 | A | * | 3/1989 | Cowan | H02J 9/061 |
| | | | | | 307/43 |
| 5,821,821 | A | * | 10/1998 | Ahdab | H03K 3/0315 |
| | | | | | 331/177 R |
| 6,548,916 | B1 | * | 4/2003 | Kanazawa | H03K 17/063 |
| | | | | | 307/10.1 |
| 7,145,383 | B2 | * | 12/2006 | Mizuno | G11C 5/147 |
| | | | | | 327/543 |

(Continued)

OTHER PUBLICATIONS

"LT4321-PoE Ideal Diode Bridge Controller", Linear Technology, 2013, Retrieved Mar. 5, 2015 from http://cds.linear.com/docs/en/datasheet/4321f.pdf, 12 pages.

(Continued)

*Primary Examiner* — Jared Fureman
*Assistant Examiner* — Michael Warmflash
(74) *Attorney, Agent, or Firm* — Edell, Shapiro & Finnan, LLC

(57) ABSTRACT

An apparatus includes a first power supply switch, a second power supply switch, and a control circuit. The first power supply switch includes a P-channel Metal Oxide Semiconductor Field Effect Transistor (PMOSFET) having a drain coupled to a first power rail to receive a first power voltage, a source coupled to an output node, and a gate to selectively turn on or off the PMOSFET to supply the first power voltage to the output node or isolate the first power rail. The second power supply switch receives a second power voltage and passes it to the output node if the second power voltage is present. The control circuit cooperates with the first power supply switch to control the gate voltage to turn on the PMOSFET if the first power voltage is present and the second power voltage is absent, and turn off the PMOSFET if the second power voltage is present.

17 Claims, 7 Drawing Sheets

(56) References Cited

U.S. PATENT DOCUMENTS

| | | | | |
|---|---|---|---|---|
| 7,701,089 | B2* | 4/2010 | Shimizu | H02J 9/061 |
| | | | | 307/150 |
| 7,978,004 | B2* | 7/2011 | Houston | H03K 17/687 |
| | | | | 327/534 |
| 8,008,953 | B1* | 8/2011 | Brumett, Jr. | H03K 17/166 |
| | | | | 327/109 |
| 8,115,336 | B1* | 2/2012 | Voo | H02J 1/00 |
| | | | | 307/36 |
| 2002/0075060 | A1* | 6/2002 | Goodell | H03K 17/162 |
| | | | | 327/427 |

OTHER PUBLICATIONS

"AN-9759—Fairchild GreenBridge™ Solution to Replace Conventional Diode Bridge in Power Over Ethernet Applications", Fairchild Semiconductor Corporation, https://www.fairchildsemi.com/application-notes/AN/AN-9759.pdf, Aug. 20, 2013, 4 pages.

"AN4006 Application note—Designing a high-efficiency (60 W on 4 pairs) PoE converter using the PM8803 and an external current booster", STMicroelectronics, http://www.st.com/st-web-ui/static/active/jp/resource/technical/document/application_note/DM00041645.pdf, Feb. 2012, 19 pages.

Donald V. Comiskey, "High-Efficiency, Class 4 PoE Powered Device, Using the TPS23754 in Active-Clamp Flyback Converter—Application Report", Texas Instruments, http://www.ti.com/lit/an/slua593/slua593.pdf, Feb. 2009, 10 pages.

"IR50015—Universal Active Oring Controller", International Rectifier, Data Sheet No. PD60229 revB, Dec. 2005, 12 pages.

"ISL6144—Data Sheet-High Voltage ORing MOSFET Controller", Intersil, FN9131.7, Oct. 6, 2011, 30 pages.

"LM5050-1/LM5050-1-Q1 High Side OR-ing FET Controller", Texas Instruments, May 2011—Revised Jun. 2013, 21 pages.

"LM5050-2 High Side OR-ing FET Controller", Texas Instruments, Nov. 2010—Revised Mar. 2013, 22 pages.

"LT4351—MOSFET Diode-OR Controller", Linear Technology, 2003, Retrieved Mar. 11, 2015 from http://cds.linear.com/docs/en/datasheet/4351fd.pdf, 20 pages.

"LTC4352—Low Voltage Ideal Diode Controller with Monitoring", Linear Technology, 2008, Retrieved Mar. 11, 2015 from http://cds.linear.com/docs/en/datasheet/4352fa.pdf, 16 pages.

"LTC4353—Dual Low Voltage Ideal Diode Controller", Linear Technology, 2012, Retrieved Mar. 11, 2015 from http://cds.linear.com/docs/en/datasheet/4353f.pdf, 16 pages.

"LTC4355—Positive High Voltage Ideal Diode-OR with Input Supply and Fuse Monitors", Linear Technology, 2007, Retrieved Mar. 11, 2015 from http://cds.linear.com/docs/en/datasheet/4355ff.pdf, 20 pages.

"LTC4358—5A Ideal Diode", Linear Technology, 2007, Retrieved Mar. 11, 2015 from http://cds.linear.com/docs/en/datasheet/4358fa.pdf, 12 pages.

"LTC4412—Low Loss PowerPath™ Controller in ThinSOT", Linear Technology, 2002, Retrieved Mar. 11, 2015 from http://www.vicorpower.com/documents/datasheets/Picor/ds_pi2001.pdf http://cds.linear.com/docs/en/datasheet/4412fb.pdf, 14 pages.

"PI2001—Cool-ORing™ Series—Universal Active ORing Controller IC", Picor: A Vicor Subsidiary, Retrieved Mar. 11, 2015 from http://www.vicorpower.com/documents/datasheets/Picor/ds_pi2001.pdf, 23 pages.

"PI2002-EVAL1 Active ORing With Load Disconnect Evaluation Board User Guide", Picor: A Vicor Subsidiary, Retrieved Mar. 11, 2015 from http://www.vicorpower.com/documents/user_guides/picor/ug_PI2002EvlBrd.pdf, 11 pages.

"PI2003—Cool-ORing® Series—Universal Active ORing Controller IC", Picor: A Vicar Subsidiary, Retrieved Mar. 11, 2015 from http://www.vicorpower.com/documents/datasheets/Picor/ds_pi2003.pdf, 16 pages.

"PI2007—Cool-ORing® Series—Universal High Side Active ORing Controller IC", Picor: A Vicor Subsidiary, Retrieved Mar. 11, 2015 from http://www.vicorpower.com/documents/datasheets/Picor/ds_pi2007.pdf, 19 pages.

"PI2121—Cool-ORing® Series—8 Volt, 24 Amp Full-Function Active ORing Solution", Picor: A Vicor Subsidiary, Retrieved Mar. 11, 2015 from http://www.vicorpower.com/documents/datasheets/Picor/ds_pi2121.pdf, 21 pages.

"PI2122—Cool-ORing® Series—12Amp Active ORing Solution With Load Disconnect", Picor: A Vicor Subsidiary, Retrieved Mar. 11, 2015 from http://www.vicor-china.com/picorpower/data_sheets/ds_pi2122.pdf, 19 pages.

"PI2127—Cool-ORing® Series—60 Volt, 12 Amp Full-Function Active ORing Solution", Picor: A Vicar Subsidiary, Retrieved Mar. 11, 2015 from http://www.vicorpower.com/documents/datasheets/Picor/ds_pi2127.pdf, 19 pages.

"N+1 and ORing Power Rail Controller", Texas Instruments, Jan. 2007—Revised Sep. 2008, 26 pages.

"ZXGD3102T8—Active OR'ing Controller", Diodes Incorporated, Issue 4, May 2009, 15 pages.

* cited by examiner

EFFICIENTLY MANAGING MULTIPLE POWER SUPPLIES

CROSS REFERENCE TO RELATED APPLICATION

This application claims priority to U.S. Provisional Application No. 62/086,760 filed Dec. 3, 2014, the entirety of which is incorporated herein by reference.

TECHNICAL FIELD

The present disclosure relates to power supply circuits.

BACKGROUND

Many systems include multiple power supplies, such as switches, wireless access points, laptops, cell phones and other battery operated devices. Existing methods for managing multiple power supplies are often inefficient or costly. For battery operated devices or devices with a fixed power range, like Power over Ethernet (PoE), efficiency is critical to supporting the available power budget, improving customer experience and safely meeting surface temperature requirements.

DESCRIPTION OF EXAMPLE EMBODIMENTS

Overview

Figure 1:
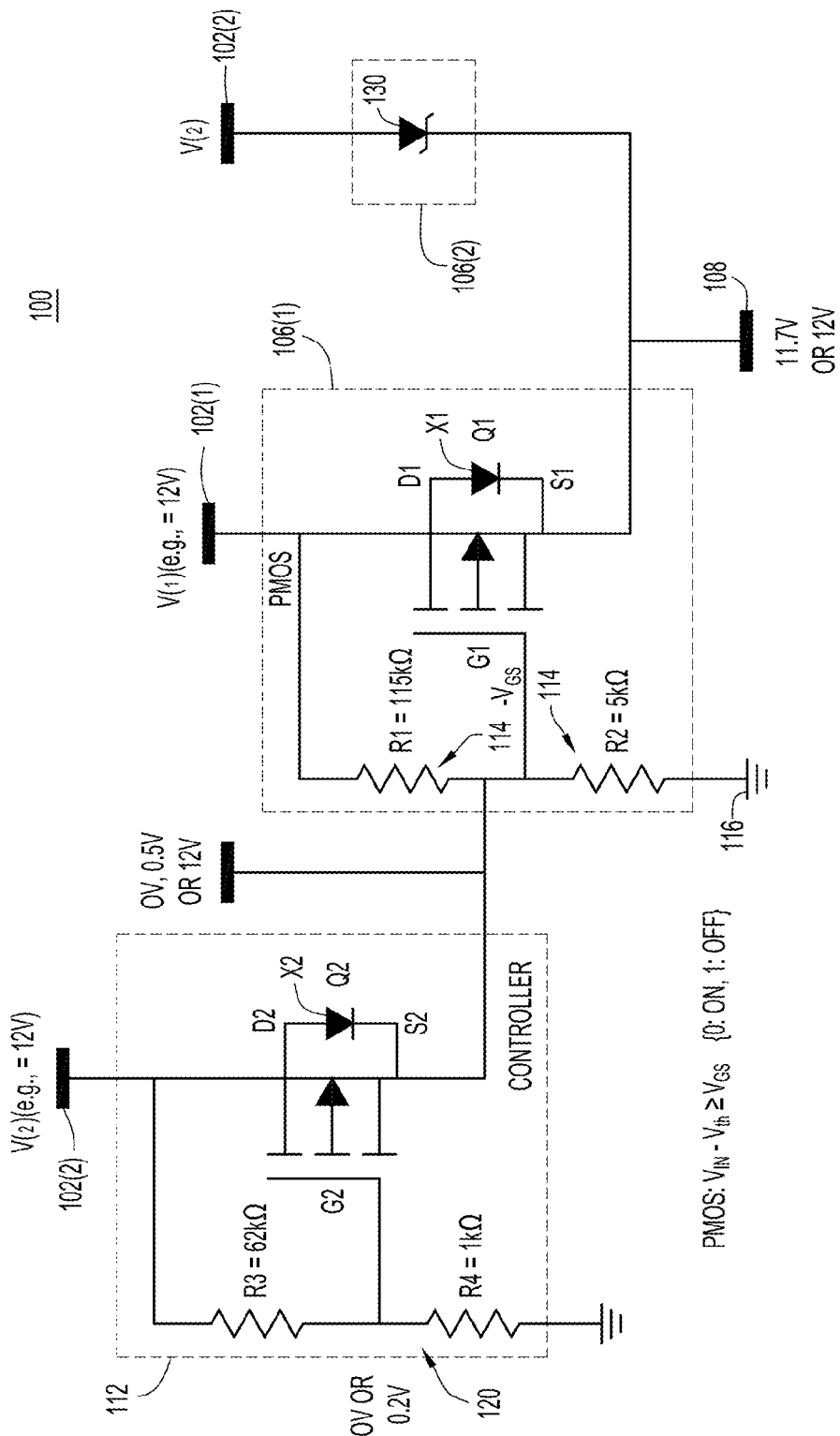
FIG. 1 is an electrical schematic diagram of a power supply OR circuit for two power supplies, which may be symmetric power supplies, according to an example embodiment.

An embodiment presented herein is directed to an apparatus including a first power supply switch, a second power supply switch, and a control circuit. The first power supply switch includes a power P-channel Metal Oxide Semiconductor Field Effect Transistor (PMOSFET) having a drain coupled to a first power rail to receive a first power voltage, a source coupled to an output node to power a load, and a gate to receive a voltage to selectively turn on or turn off the power PMOSFET to supply the first power voltage to the output node or isolate the first power rail from the output node, respectively. The second power supply switch is coupled to a second power rail to receive a second power voltage and to pass to the output node the second power voltage when present. The control circuit is coupled to the second power rail and the gate of the power PMOSFET, and cooperates with the first power supply switch to control the gate voltage to (i) turn on the power PMOSFET if the first power voltage is present and the second power voltage is absent, and (ii) turn off the power PMOSFET if the second power voltage is present.

Another embodiment includes multiple power supply switches each including a respective power PMOSFET having a source coupled to a common output to power a load, a drain to receive a respective one of multiple power voltages ranked incrementally from a lowest priority to a highest priority, and a gate to receive a voltage to turn on or turn off the power PMOSFET to supply the respective power voltage to the common output node or block the power voltage from the common output node, respectively. Also, multiple control modules are each coupled to, and configured to control, a respective one of the power PMOSFETs. Each control module is configured to receive all of the power voltages having higher priorities than the power voltage received at the respective power PMOSFET controlled by that control module, where each control module controls the gate voltage of the respective power PMOSFET to turn off the respective power PMOSFET if any of the higher priority power voltages are present, or permit the respective power PMOSFET to turn on responsive to the respective power voltage if all of the higher priority power voltages are absent.

DETAILED DESCRIPTION

Embodiments herein enable multiple prioritized power supplies in a system to operate safely and concurrently. In an embodiment, this is accomplished by utilizing two circuit elements, i.e., diodes, to force current in a forward direction thus preventing damage or instability. In particular, a diode is a forward only conducting device. The embodiment uses a Schottky diode associated with a high priority or unconstrained power source (also referred to herein as a "master" power source) and an internal body diode of a power P-channel Metal Oxide Semiconductor Field Effect Transistor (PMOSFET) associated with a lower priority or constrained power source (also referred to herein as a "slave" power source) to guarantee forward current flow in either the master or the slave power source only, i.e., in a direction toward a powered load only. The Schottky diode is relatively low cost while the power PMOSFET minimizes cost while maximizing efficiency. If two or more constrained power sources are used, then multiple PMOSFETs may be used to improve total efficiency.

In power supply systems that including multiple power supplies to power a load, the load draws current from a highest voltage source available. If the highest voltage source switches between the power supplies (either from natural fluctuation in regulation or due to voltage droop) the load will draw current from the new highest voltage source. Often, variable loads with closely designed power supplies can cause frequent switching between power supplies, resulting in heavy stresses on and eventual failure in the supplies. Embodiments herein protect the power supplies by ensuring only a single power supply is actively sourcing the load during a power supply insertion event (i.e., as other power supplies turn on) to prevent a graceful or catastrophic failure. The embodiments achieve this safety mechanism by using a hierarchy of power sources with a single dominant power supply to power the load. If a master power supply is enabled, the enabled master power supply triggers a signal PMOSFET of a circuit controller to disable a power PMOSFET of slave supply. This technique prevents power supply metastability by ensuring only a single power supply is actively driving the load. The term "power source" is also referred to as "power supply voltage" or "power voltage" in the ensuing description.

Figure 2:
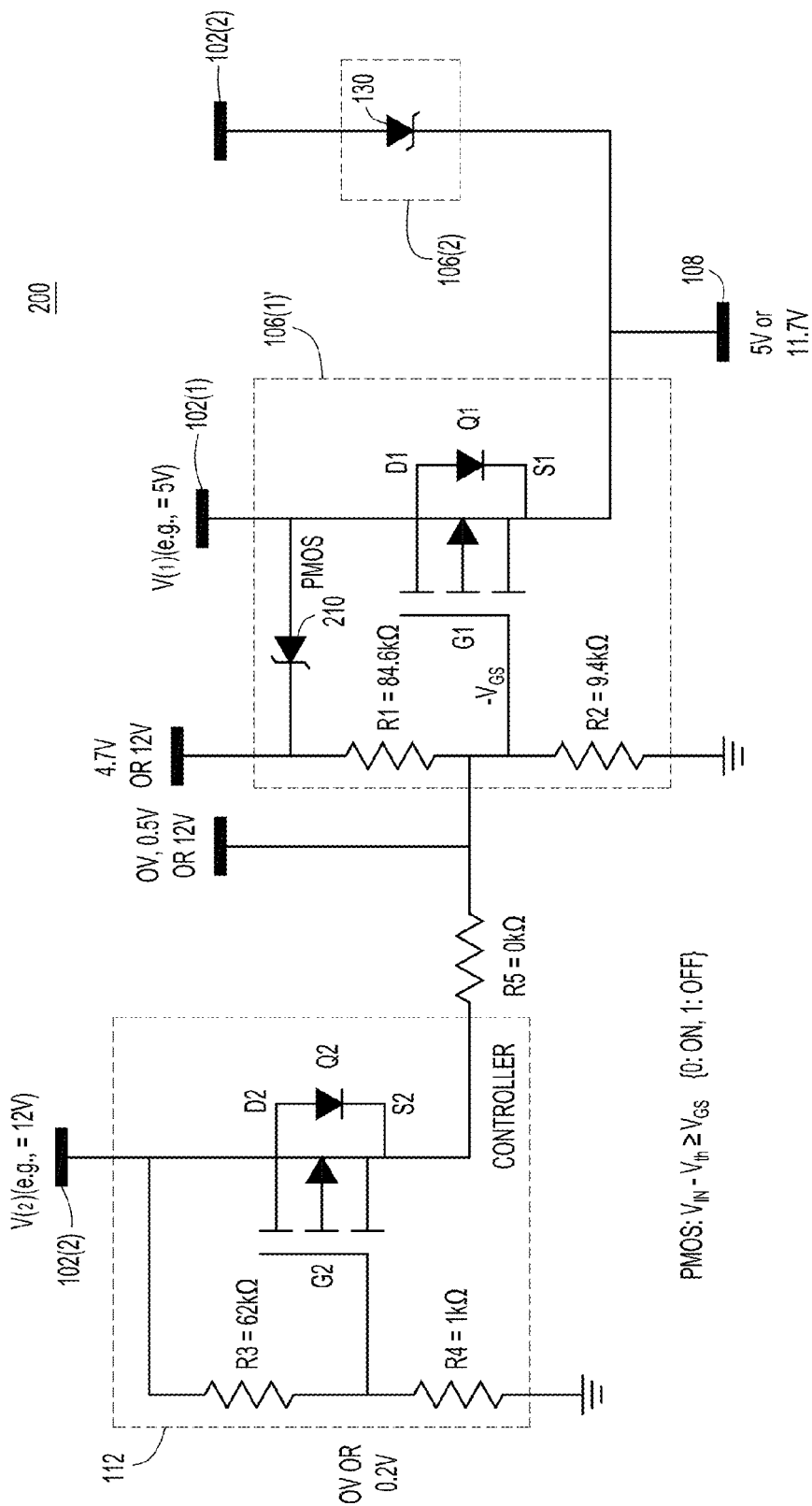
FIG. 2 is an electrical schematic diagram of a power supply OR circuit for two power supplies, which may be asymmetric power supplies, according to an example embodiment.
Figure 3:
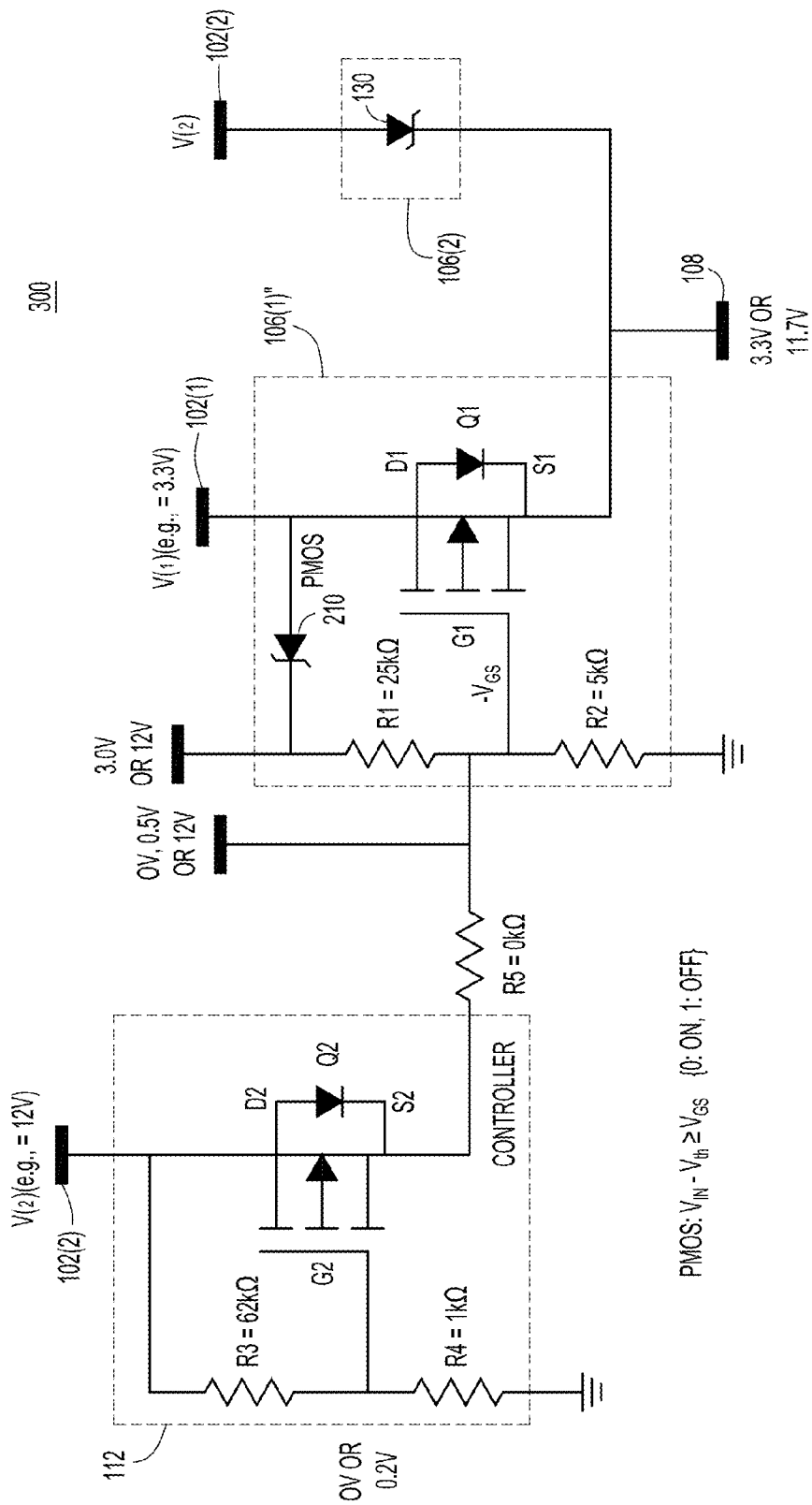
FIG. 3 is a schematic diagram of a power supply OR circuit useful for very asymmetric power supplies, according to an example embodiment.

With reference to FIG. 1, there is shown a schematic diagram of an example master-slave power supply OR circuit 100. Power supply OR circuit 100 is also referred to as an "active PMOSFET" power supply OR circuit 100. As depicted in FIG. 1, a first power rail 102(1) receives a low priority or slave power voltage V(1) from a low priority/slave power supply (not shown in FIG. 1), and a second power rail 102(2) receives a high priority or master power voltage V(2) from a high priority/master power supply (also not shown in FIG. 1). A "power rail" may be a circuit terminal, node, or conductive trace, for example. Master power voltage V(2) may be a direct current (DC) voltage present at a jack plug/input, and slave power voltage V(1) may be a 12V Power-over-Ethernet (PoE) voltage, for example. In the example of FIG. 1, slave power voltage V(1) may be 12 Volts (V) and master power voltage V(2) may also be 12V, although voltages other than 12V may be used and the master and slave voltages V(2) and V(1) may be different from each other (as shown in FIG. 2 and FIG. 3 described below). Power rails 102 supply their respective power voltages, and power current, to power inputs of power supply OR circuit 100, as described below.

Power supply OR circuit 100 also includes: a slave power supply output switch 106(1) coupled to and between power rail 102(1) and an output node 108 that powers a load connected thereto (not shown); a master power supply output switch 106(2) coupled to and between power rail 102(2) and the output node; and a control circuit 112 having an input coupled to power rail 102(2) and an output coupled to a control input of the slave power supply output switch and which controls the slave power supply output switch to selectively connect the slave power supply to, or disconnect the slave power supply from, the output node, as described below. Circuit 100 is referred to as a power supply "OR" circuit because the respective outputs of power supply output switches 106(1) and 106(2) are wire OR'd together at output node 108. Also, a "power supply output switch" is referred to herein as simply a "power supply switch."

As used herein, "coupled" is construed broadly to mean either "directly connected" or "indirectly connected." For example, a first circuit component "coupled" to a second circuit component covers an arrangement in which the first and second circuit components are connected directly to each other and an arrangement in which the first and second circuit components are connected to each other through one or more intermediate circuit components.

Slave power supply switch 106(1) and master power supply switch 106(2) are considered low and high priority power supply switches in accordance with the priorities of power voltages V(1) and V(2) received thereby, respectively. At any given time, slave power voltage V(1) and master power voltage V(2) may be concurrently received/present at respective power rails 102(1) and 102(2). Alternatively, only one of slave power voltage V(1) and master power voltage V(2) may be present, while the other is absent at the output node. As will be described below, if master power voltage V(2) is received/present at power rail 102(2), master power supply switch 106(2) conducts and thereby passes the master power voltage to node 108, and slave power voltage V(1) (i.e., the slave power supply) is preempted. On the other hand, if master power voltage V(2) is not present at power rail 102(2) and slave power voltage V(1) is present at power rail 102(1), only then does slave power supply switch 106(1) turn on to supply slave power voltage V(1) to output node 108.

Slave power supply switch 106(1) includes a power PMOSFET Q1 to conduct a power supply voltage and current from power rail 102(1) to output node 108. Power PMOSFET Q1 includes a drain D1 coupled to power rail 102(1), a source S1 coupled to output node 108 to drive the load connected thereto, and a gate G1 (which is the control input of the slave power supply switch) to receive a voltage at gate G1 that selectively turns on or turn off the power PMOSFET to thereby pass slave power voltage V(1) to the output node (i.e., to connect the slave power voltage to the output node) or isolate power rail 102(1) from the output node (i.e., disconnect the slave power supply switch from the output node), respectively. Power PMOSFET Q1 also includes an internal body diode X1 configured to forward conduct in a direction from drain D1 to source S1. Slave power supply switch 106(1) also includes a voltage divider 114 having first and second series-connected resistors R1 and R2 respectively coupled to and between power rail 102(1) and gate G1, and gate G1 and a ground rail 116 that is held at a ground potential (e.g., 0 V). The resistance values depicted in FIG. 1 for resistors R1 and R2 are example values and other values that are scaled to a particular voltage level for power voltage V(1) may be used. Also, PMOSFET Q1 is referred to as a "power" PMOSFET because of its role in conducting "power" supply voltage and current to the load connected to output node 108. Also, power MOSFET Q1 is constructed to have a source-drain current path sufficiently large to handle the power drawn from power rail 102(1) by the load connected to output node 108 when power PMOSFET Q1 is turned on.

An advantage of using power PMOSFET Q1 instead of a conventional Schottky diode in power supply switch 106(1), for example, is that the power PMOSFET, when operating, may save 600 mW in 25.5 W applications (the savings increase linearly with the application's power) over the Schottky diode. Another advantage arises from the way that power PMOSFET Q1 operates, that is, as long as the power voltage on power rail 102(1) is higher than a threshold voltage of power PMOSFET, the power PMOSFET will turn on. Hence, the PMOSFET may be used instead of an N-channel MOSFET (NMOSFET). If slave power voltage V(1) is at least 10V, gate G1 of power PMOSFET Q1 can be directly connected to the ground potential. For power supply applications such as those described herein, power PMOSFET Q1 is connected "backward" (with respect to normal practice) to orient its body diode X1 in a direction of normal current flow.

Use of a PMOSFET instead of an NMOSFET in the embodiments described herein is advantageous for the following reasons. To turn on an NMOSFET in a conventional circuit, the NMOSFET gate-source voltage must be greater than the NMOSFET threshold voltage and thus an additional voltage source is typically used to apply a voltage to the gate of the NMOSFET to keep the gate-source forward biased. The NMOSFET gate voltage must be larger than a sum of the output voltage driven by the NMOSFET and the threshold voltage. This requirement on the gate voltage is undesirable in a circuit that does not have an extra power voltage at a higher potential than the power voltages readily available. Thus, a complex and expensive digital controller with an integrated charge pump to create the extra voltage at the higher potential is often used to solve problem. Use of a PMOSFET instead of an NMOSFET advantageously avoids the extra cost and complexity associated with the extra voltage source needed for the NMOSFET.

In an embodiment, control circuit 112 is an analog controller, which uses all analog circuit components, e.g., resistors, FETs, and the like. For example, control circuit 112 does not include digital processors, such as a digital microcontroller, analog-to-digital converters or digital-to-analog converters. Control circuit 112 includes a signal PMOSFET Q2 having a drain D2 coupled to power rail 102(2), a source S2 coupled to gate G1 of power PMOSFET Q1, and a gate G2 to receive a voltage to turn on or turn off the PMOSFET Q2 and thereby pass master power voltage V(2) to gate G1 (i.e., to connect the master power voltage to gate G1) or isolate power rail 102(2) (and master power voltage (V(2))) from gate G1, respectively. In other words, PMOSFET Q2 has its source-drain (SD) current path (also referred to simply as a "source-drain path") coupled between power rail 102(2) and gate G1 so as to selectively connect and disconnect power rail 102(2) to gate G1 via the gate G2 voltage. Signal PMOSFET Q2 also includes an internal body diode X2 configured to forward conduct in a direction from drain D2 to source S2 of the signal PMOSFET. PMOSFET Q2 is referred to as a "signal" PMOSFET because of its role in passing a control "signal" or voltage to gate G1 of power MOSFET Q1. Control circuit 112 further includes a voltage divider 120 having third and fourth series-connected resistors R3 and R4 respectively coupled between power rail 102(2) and gate G2 and gate G2 and ground rail 116. The resistance values depicted in FIG. 1 for resistors R3 and R4 are example values and other values that are scaled to a particular voltage level for power voltage V(2) may be used.

A source-drain path of power PMOSFET Q1 is substantially wider than the source-drain path of signal PMOSFET Q2 when the PMOSFETs Q1 and Q2 respectfully operate in their fully-on saturated regions, so that PMOSFET Q1, when turned on, can source a relatively large power supply current to output node 108 to power the load connected thereto; signal PMOSFET Q2 does not need to supply such large current because it operates only as a controller for the power PMOSFET.

Power supply OR circuit 100 also includes master power supply switch 106(2) coupled between master power rail 102(2) and output node 108. In the embodiment of FIG. 1, master power supply switch 106(2) includes a Schottky diode 130 configured to forward conduct in a direction from power rail 102(2) to output node 108, i.e., an anode and a cathode of diode 130 are respectively coupled to power rail 102(2) and output node 108.

Power supply OR circuit 100 operates in the following manner. In a first scenario, slave power voltage V(1) is present at power rail 102(1) while master power voltage V(2) is not present at power rail 102(2), i.e., the slave power voltage is present and the master power voltage is absent. Under such conditions, master power supply switch 106(2) is not conducting, thereby electrically isolating power rail 102(2) from output node 108. That is, in the example of FIG. 1, diode 130 is not conducting in its forward direction. Also, in control circuit 112, the voltage at gate G2 of PMOSFET Q2 is clamped to the ground potential (e.g., 0V), thus ensuring that PMOSFET Q2 is turned off to isolate power rail 102(2) from gate G1 of PMOSFET Q1 in slave power supply switch 106(1).

As a result, voltage divider 114 in slave power supply switch 106(1) drives the voltage at gate G1 to a first voltage level responsive to slave power voltage V(1) to turn on PMOSFET Q1 (and thus turn on/enable slave power supply switch 106(1) to pass the slave power voltage V(1) to output node 108). Assuming that slave power voltage V(1) is equal to 12V and resistors R1 and R2 of voltage divider 114 have resistance values as depicted in FIG. 1, the first voltage level at gate G1 is approximately 0.5V, which creates a negative gate-source voltage $V_{GSQ1}$ across PMOSFET Q1 equal to −11.5V. This gate-source voltage $V_{GSQ1}$ is sufficiently negative to ensure that PMOSFET Q1 operates in its saturation region and is fully turned on so that the source-drain path of PMOSFET Q1 passes current from power rail 102(1) to the load connected to output node 108, which receives the full 12V of slave power voltage V(1).

In a second scenario, master power voltage V(2) is present at power rail 102(2), while slave power voltage V(1) may or may not be present at power rail 102(1). Under such conditions, voltage divider 120 in control circuit 112 drives the gate voltage at gate G2 responsive to master power voltage V(2) to a voltage level to turn on PMOSFET Q2, whether slave power voltage V(1) is present or not. Once turned on, PMOSFET Q2 drives the voltage at gate G1 of PMOSFET Q1 to a second voltage level V(2) (as opposed to the first voltage level discussed above) that turns off PMOSFET Q1.

More specifically in the second scenario, assuming that master power voltage V(2) is equal to 12V and resistors R3 and R4 of voltage divider 120 have resistance values as depicted in FIG. 1, the voltage at gate G2 that turns on PMOSFET Q2 is equal to 0.2V, which creates a negative gate-source voltage $V_{GSQ2}$ across PMOSFET Q2 equal to −11.8V. At −11.8V, gate-source voltage $V_{GSQ2}$ is sufficiently negative to ensure that PMOSFET Q2 operates in its saturation region and is fully turned on so that the source-drain path of PMOSFET Q2 passes master power voltage V(2) (e.g., 12V) from power rail 102(2) to gate G1, which turns off PMOSFET Q1. The voltage level of 12V at gate G1 creates a positive gate-source voltage $V_{GSQ1}$ equal to 0.3V across PMOSFET Q1. This gate-source voltage $V_{GSQ1}$ is sufficiently positive to ensure that PMOSFET Q1 operates in its cut-off region so that it is fully turned off. With PMOSFET Q1 turned off, slave power rail 102(1) (and slave power voltage V(1)) is disconnected from output node 108.

Still in the second scenario, while slave power supply switch 106(1) is turned off, master power supply switch 106(2) is conducting responsive to the presence of master power voltage V(2). In the embodiment of FIG. 1, master power voltage V(2) causes diode 130 of master power supply switch 106(2) to forward conduct/turn on and supply the 12V of the master power voltage, less a 0.3V voltage drop across the diode, to the load connected to output node 108. Therefore, output node 108 receives a power voltage of 12V−0.3V=11.7V.

In a third scenario, neither slave power voltage V(1) nor master power voltage V(2) is present. Under such conditions, master power supply switch 106(2) and slave power supply switch 106(1) are both turned off and power rails 102(2) and 102(1) are thus isolated from output node 108. Also, the voltages at gates G1 and G2 are clamped to the ground potential, e.g., 0V.

Thus, in the first, second, and third scenarios described above, only master power rail 102(2) (and thus master power voltage V(2)) or slave power rail 102(1) (and thus slave power voltage V(1)) drives the load connected to output node 108 at any given time.

A list of example operating circuit parameters for circuit 100 is provided below:

a. $P_{System} = V_{IN}I_{IN} = 12V*2.125\ A = 25.5\ W$
b. $P_{Diode} = V_F I_F = 300\ mV*2.125\ A = 638\ mW$;
c. $P_{FET} = I^2 R_{DS} = 10\ m\Omega*(2.125\ A)^2 = 45\ mW$;
d. $P_{Savings} = P_{Diode} - P_{FET} = 638\ mW - 45\ mW = 593\ mW$;
e. $P_{R1-R2} = 0.5\ mW, I_{12} = 100\ \mu A$;
f. $V_{GS(Q1)} = \{0V, -11.5V, 0.3V\}$; and
g. $V_{GS(Q2)} = \{0V, -0.2V, -11.8V\}$.

The above operating circuit parameters are defined as follows:

a. $P_{Diode}$—the power dissipated in Schottky diode 130 when conducting, where $V_F$ is the voltage drop across the diode when conducting;
b. $P_{FET}$—the power dissipated in power PMOSFET Q1 when conducting;
c. $P_{Savings}$—the power saved by using power PMOSFET Q1 instead a Schottky diode;
d. $P_{R1-R2}$—the power dissipated in the control circuit 114 when V(1) is present; and
e. $V_{GS1}$, $V_{GS2}$—the gate-source voltages in Q1, Q2 under the various operating scenarios described above.

The power supply OR circuit of FIG. 1 may be generalized to power supplies that operate with different power voltages, as described below in connection with FIGS. 2 and 3.

With reference to FIG. 2, there is shown a schematic diagram of an example power supply OR circuit 200 that operates with multiple different power voltages. Power supply OR circuit 200 is similar to power supply OR circuit 100 in that power supply OR circuit 200 includes control circuit 112, master power supply switch 106(2), and a slave power supply switch 106(1)' that is similar to slave power supply switch 106(1), except for the following differences. First, slave power voltage V(1) received at power rail 102(1) (and thus received at slave power supply switch 106(1)') is less than master power voltage V(2) received at power rail 102(2). In the example of FIG. 2, master power voltage V(2) is a 12V DC voltage and slave power voltage V(1) is a 5V PoE voltage. Second, a Schottky diode 210 is coupled in series with resistor R1 between the resistor R1 and power rail 102(1) (and drain D1) such that an anode of the diode is coupled to the power rail and a cathode of the diode is coupled to the resistor. Third, an optional current limiting resistor R5 is connected between source S2 and gate G1 to limit current flowing from power rail 102(2) through the source-drain path of PMOSFET Q2 when Q2 is turned on, if necessary.

Power supply OR circuit 200 operates similarly to power supply OR circuit 100 as described above, except that when master power voltage V(2) is present and signal PMOSFET Q2 is thus turned on, Schottky diode 210 prevents master power voltage V(2) (e.g., 12V) presented at gate G1 from feeding back into the 5V PoE power rail 102(1). This protects components associated with the slave power supply (not shown) connected to slave power rail 102(1) from being damaged by the 12V. Power supply OR circuit 200 saves approximately 1250 mW in 25.5 W applications (the savings increase linearly with the application's power) over a conventional Schottky diode OR circuit and results in greater system efficiency with reduced loss from low voltage regulators downstream from the power supply.

A list of example operating circuit parameters for circuit 200 is provided below:

a. $P_{Diode} = V_F I_F = 0.3V*5.1\ A = 1530\ mW$;
b. $P_{FET} = I^2 R_{DS} = 10\ m\Omega*(5.1\ A)^2 = 260\ mW$;
c. $P_{Savings} = P_{Diode} - P_{FET} = 1530\ mW - 260\ mW = 1270\ mW$;
d. $P_{R1-R2} = 0.5\ mW, I_{12} = 100\ \mu A$;
e. $V_{GS(Q1)} = \{0V, -4.5V, 0.3V\}$; and
f. $V_{GS(Q2)} = \{0V, -0.2V, -11.8V\}$.

With reference to FIG. 3, there is shown schematic diagram of an example power supply OR circuit 300 that operates with different power voltages. Power supply OR circuit 300 is configured and operates similarly to power supply OR circuit 100 and 200, except that power supply OR circuit 300 operates with a slave power voltage V(1) of 3.3V and includes resistance values for resistors R1 and R2 (depicted in FIG. 3) that account for the lower slave power voltage. Power supply OR circuit 300 is useful in low voltage applications, for example.

A list of example operating parameters for circuit 300 is provided below:

a. $P_{Diode} = V_F I_F = 0.3V*8.5\ A = 2550\ mW$;
b. $P_{FET} = I^2 R_{DS} = 10\ m\Omega*(8.5\ A)^2 = 723\ mW$;
c. $P_{Savings} = P_{Diode} - P_{FET} = 2550\ mW - 723\ mW = 1827\ mW$;
d. $P_{R1-R2} = 0.5\ mW, I_{12} = 100\ \mu A$;
e. $V_{GS(Q1)} = \{0V, -2.5V, 0.3V\}$; and
f. $V_{GS(Q2)} = \{0V, -0.2V, -11.8V\}$.

The embodiments described above may also be generalized for multiple prioritized power supply switches combined in a power supply OR circuit described below in connection with FIG. 4, and in which the use of multiple power PMOSFETs, one for each of the power supply switches, saves significant power. The combined in power supply OR circuit ensures that a single power supply drives the load at a more efficient operating point than lightly or moderately loaded power supplies (under a weakly or strongly shared load system). For each power PMOSFET, an individual signal PMOSFET may be used to disable the power PMOSFET for every voltage source with a higher priority, as is now described.

Figure 4:
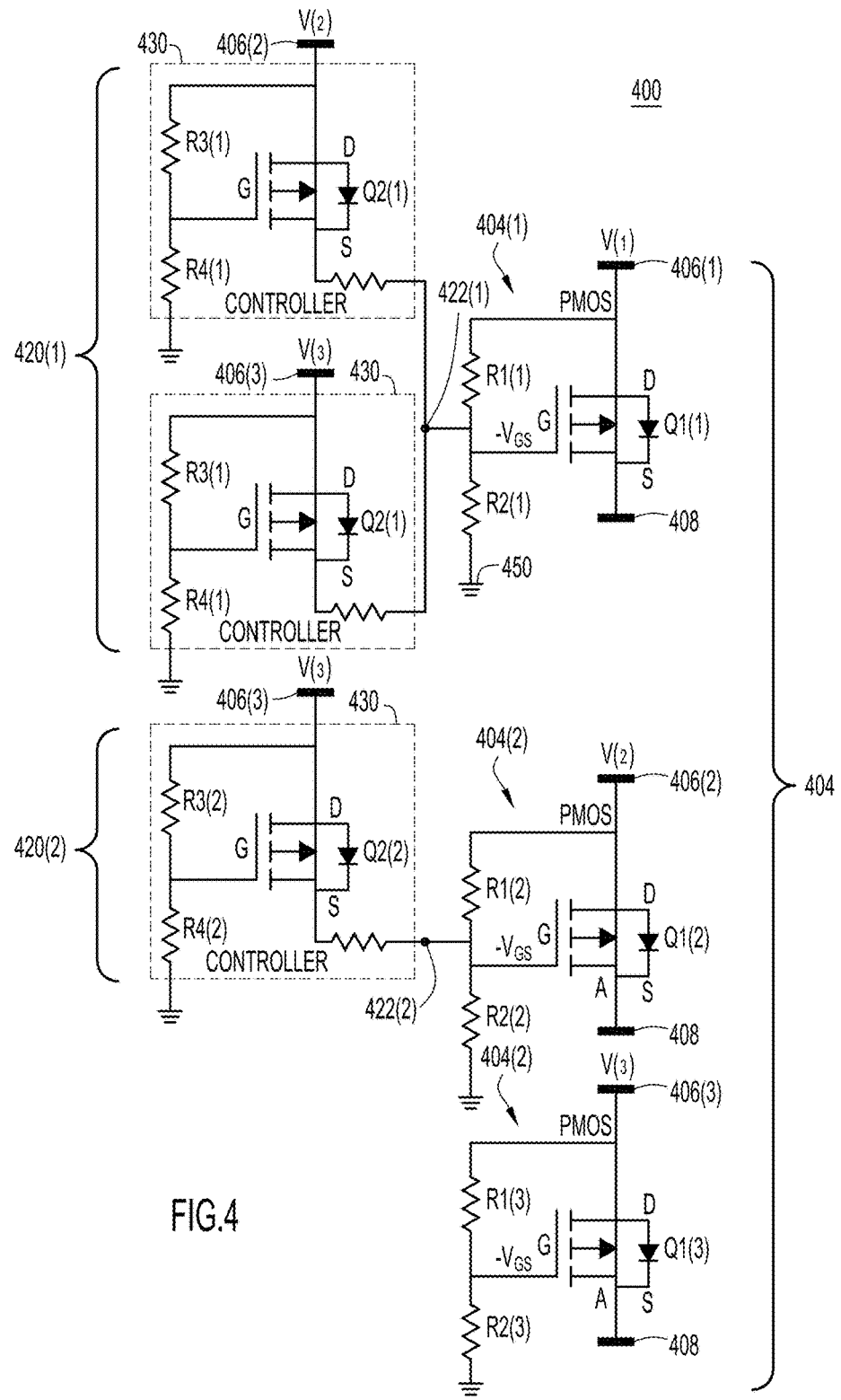
FIG. 4 is a schematic diagram of a power supply OR circuit for more than two power supplies, which may be symmetric power supplies, according to an example embodiment.

With reference to FIG. 4, there is a schematic diagram of an example power supply OR circuit 400 for multiple prioritized power supplies (not shown) that provide prioritized voltages to the power supply OR circuit. Power supply OR circuit 400 includes multiple prioritized power supply switches 404 (one for each of the prioritized power supplies), including power supply switches 404(1), 404(2), and 404(3) each having a power voltage input coupled to a respective one of power rails 406(1), 406(2), and 406(3) and a respective output coupled to a common output node 408 to power a load connected thereto (not shown). Power rails 406(1), 406(2), and 406(3) respectively receive independent prioritized power voltages V(1), V(2), and V(3) ranked incrementally from a lowest priority (V(1)) to a highest priority (V(3)). Each power supply switch 404(i) is ranked in accordance with the power voltage (i) received thereby. In an example, each of the power voltages may be 56V, although other power voltages may be used.

Each power supply switch 404(i) is configured and operates similarly to power supply switch 106(1) already described. For example, each power supply switch 404(i) respectively includes a power PMOSFET Q1 having a source-drain path coupled between the power rail 406(i) and common output node 408, and a gate to receive a respective gate voltage to turn on or turn off the power PMOSFET Q1 to supply respective power voltage V(i) received thereby to common output node 408 or isolate respective power rail 406(i) from the common output node, respectively. Each power supply switch 404(i) also includes a respective voltage divider comprising resistors R1(i) and R2(i), as described in connection with FIG. 1.

Power supply OR circuit 400 also includes multiple control modules 420(1) and 420(2) each to control a respective one of lower priority power supply switches 404(1) and 404(2). Highest priority power supply switch 404(3) does not require a control module, as will be described below. Each control module 420(i) receives only the power voltages among power voltages V(1)-V(3) that have higher priorities than power voltage V(i) received by power supply switch 404(i) that is controlled by that control module. For example, control module 420(1) to control power supply switch 404(1) receives power voltages V(2) and V(3), while control module 420(2) to control power supply switch 404(2) receives only power voltage V(3).

Each control module 420(i) includes a respective control output 422(i) coupled to the gate of the power PMOSFET of power supply switch 404(i) that is controlled by that control module. Each control module 420(i) derives a control voltage at the control output 422(i) responsive to the higher priority voltages (i.e., the power voltages with priorities higher than that of power voltage V(i)) to turn on or turn off power supply switch 404(i). More specifically, each control module 420(i) derives the control voltage at control output 422(i) to: turn off the respective power PMOSFET for power supply 404(i) if any of the higher priority power voltages are present; and otherwise permit the power PMOSFET to turn on responsive to power voltage V(i) if all of the higher priority power voltages are absent.

Each control module 420(i) includes a number of control circuits 430 equal to the number of higher priority voltages received by the control module, i.e., one control circuit 430 for each higher priority voltage. Each control circuit 430 is configured and operates similarly to control circuit 112. For example, each control circuit 430 respectively includes (i) a signal PMOSFET having its drain coupled to a respective one of the higher priority voltages (i.e., the drain is coupled to the power rail that receives that higher priority voltage) and its source coupled to control node 422(i); and (ii) a voltage divider including resistors R3(i) and R4(i) coupled between the respective one of the higher priority voltages and a ground rail 450. If control module 420(i) receives multiple higher priority voltages (e.g., such as with control module 420(1)), the multiple signal PMOSFETS of the control module have their respective sources wire-OR'd together at control node 422(i) (e.g., such as at control node 422(1)).

In operation, each power supply switch 404(i) enables its own power PMOSFET via its local voltage divider acting on the power PMOSFET gate, as described above in connection with FIG. 1; however, if another power supply is inserted with a higher priority than that associated with power supply switch 404(i), i.e., a power voltage with a higher priority than that of V(i) is received at control module 420(i), the control circuit 430 in control module 420(i) that received the higher priority power voltage turns on and disables the power PMOSFET in power supply switch 404(i), i.e., the signal PMOSFET drives the voltage at control node 422(i) to a voltage that turns off the power PMOSFET.

A difference in power supply switch OR circuit 400 compared to the power supply OR circuits of FIGS. 1-3 is the addition of the multiple control circuits 430 so that each control circuit is able to disable the power PMOSFET for one power supply. When two or more power supplies have a higher priority, a control circuit (430) is needed to disable the power PMOSFET for each power supply with a higher priority. Thus, power supply switch 404(1) is controlled by two control circuits 430, power supply switch 404(2) is controlled by one control circuit 430, and power supply switch 404(3) does not operate under control of any control circuits. Each of power supply switches 404 includes a respective power PMOSFET instead of a Schottky diode, which enables each power supply switch to handle extremely high power (often 1 kW or greater). At such high power, losses due to a Schottky diode would be too great.

Figure 5:
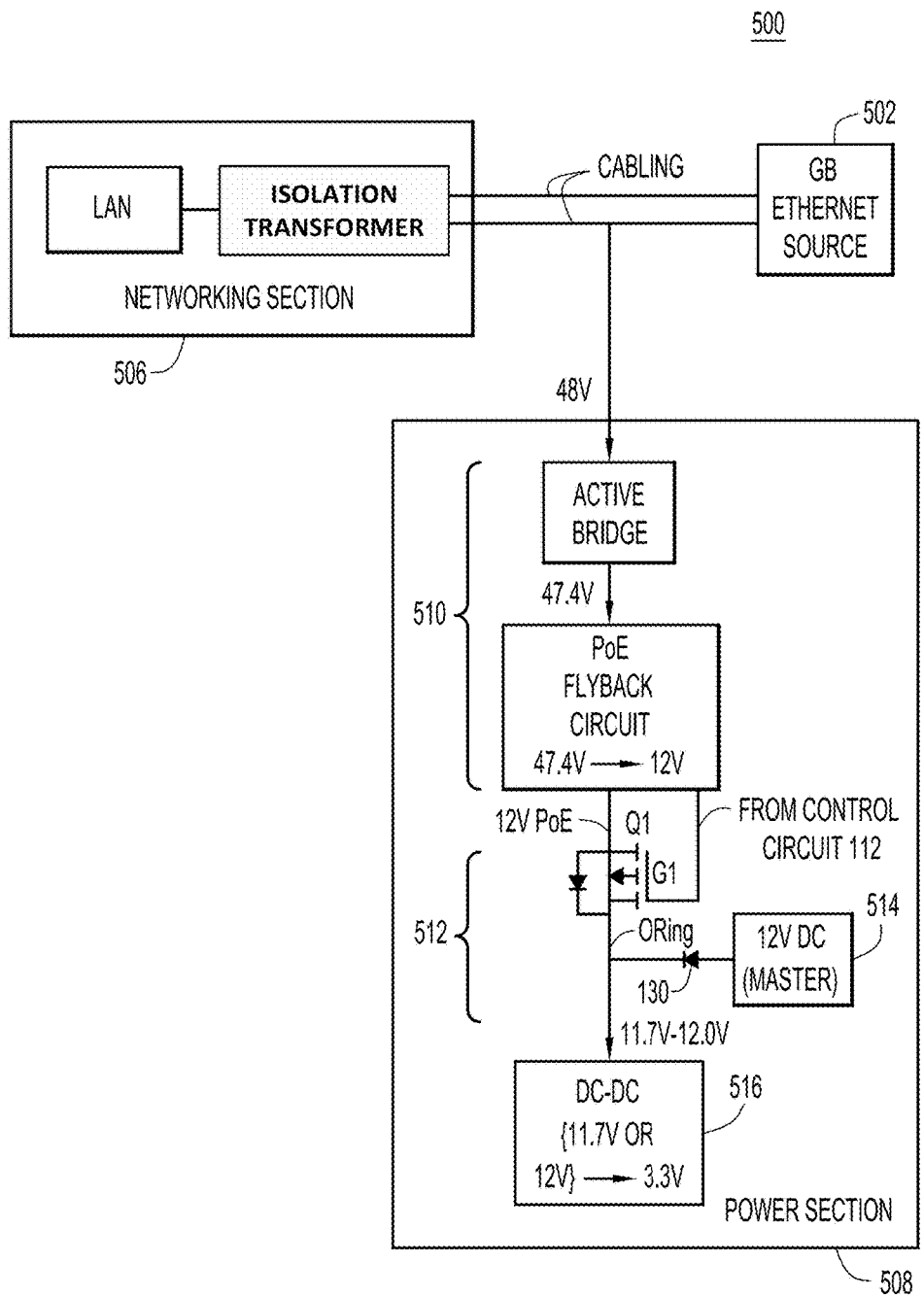
FIG. 5 is a system block diagram of an application of the power supply OR circuit shown in FIG. 1, according to an example embodiment.

Reference is now made to FIG. 5. FIG. 5 is a diagram of an example active PMOSFET OR system 500. System 500 includes an Ethernet source 502 connected to a networking section 506 and a power section 508. Power section 508 includes, a PoE regulator 510, a PoE-DC/DC interface 512 that employs the power supply OR circuit depicted in FIG. 1 or 2 (depending on the output of the PoE regulator), a 12V DC Jack 514 to supply a master power voltage of 12V as a Jack input to the interface 512, and a DC-DC converter 516. PoE-DC/DC interface 512 includes power MOSFET Q1 and Schottky diode 130 as depicted in FIG. 1 or 2, and control circuit 112 is not shown. The 12V DC Jack input (provided to Schottky diode 130) and the 12V PoE output (provided into the drain of Q1) are combined via power PMOSFET Q1. In a corner case, if the PoE power budget is close to the 802.3af (13 W) limit, the power MOSFET Q1 can help meet the power budget requirements. When the system receives power from DC jack 514, it sends an electrically isolated signal to the PoE regulator 510 to disable it. This is a second method to avoid stability issues when PoE regulator 510 and DC Jack 514 both power the system concurrently; however, this method is optional and can be removed for additional cost savings since the hierarchy of power supplies also avoids this issue.

The system of FIG. 5 operates as follows. Data and power arrive from source 502 over an Ethernet cable (not shown) as per the IEEE 802.3af/at standards, for example. Data is diverted to networking section (LAN card) 506 and power is diverted to power section 508. PoE regulator 510 converts the power to 12V PoE. The active PMOSFET OR circuit 512 passes the 12V from the PoE or the DC Jack (depending on availability and priority) to DC-DC converter 516, which further regulates the voltage as necessary to provide system voltages. The system voltages power networking section 506.

Figure 6:
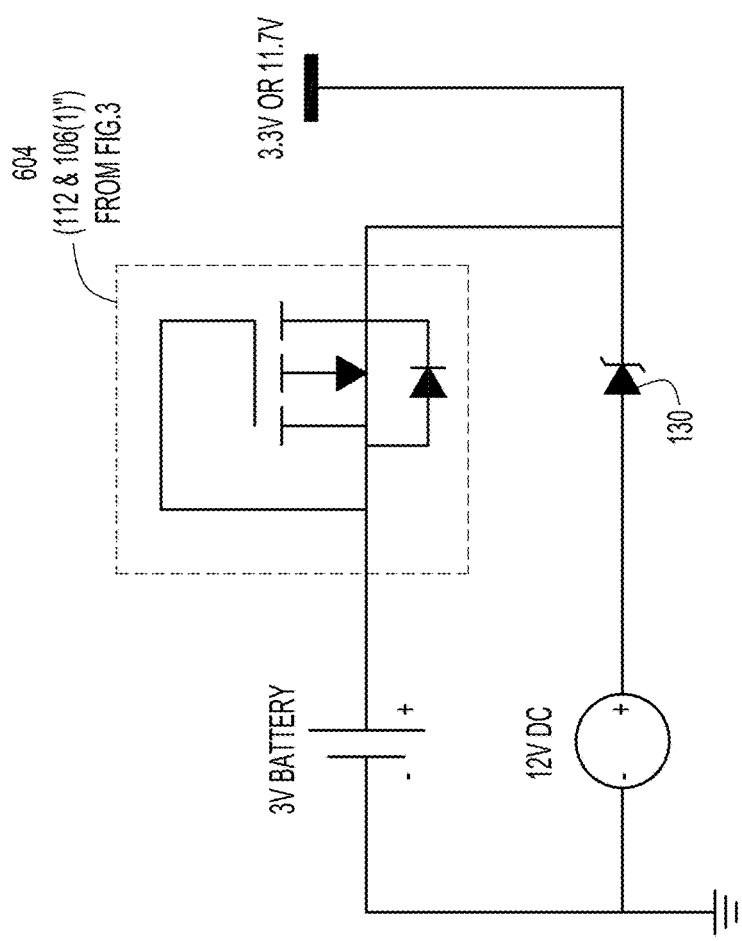
FIG. 6 is a system block diagram of an application of the power supply OR circuit shown in FIG. 3 for battery applications, according to an example embodiment.

FIG. 6 is a system diagram illustrating use of the active PMOSFET power supply OR circuit of FIG. 3, in a battery application. In FIG. 6, a box 604 having a dotted outline represents circuits 112 and 106(1)" from FIG. 3. The circuit of FIG. 6 operates as follows. The active PMOSFET OR circuit comprising Schottky diode 130 and 604 (where 604 includes control circuit 112 and power supply switch 106(1)" not shown) passes 3V from the battery or 12V from the DC Jack (depending on availability and priority) to the system.

Figure 7:
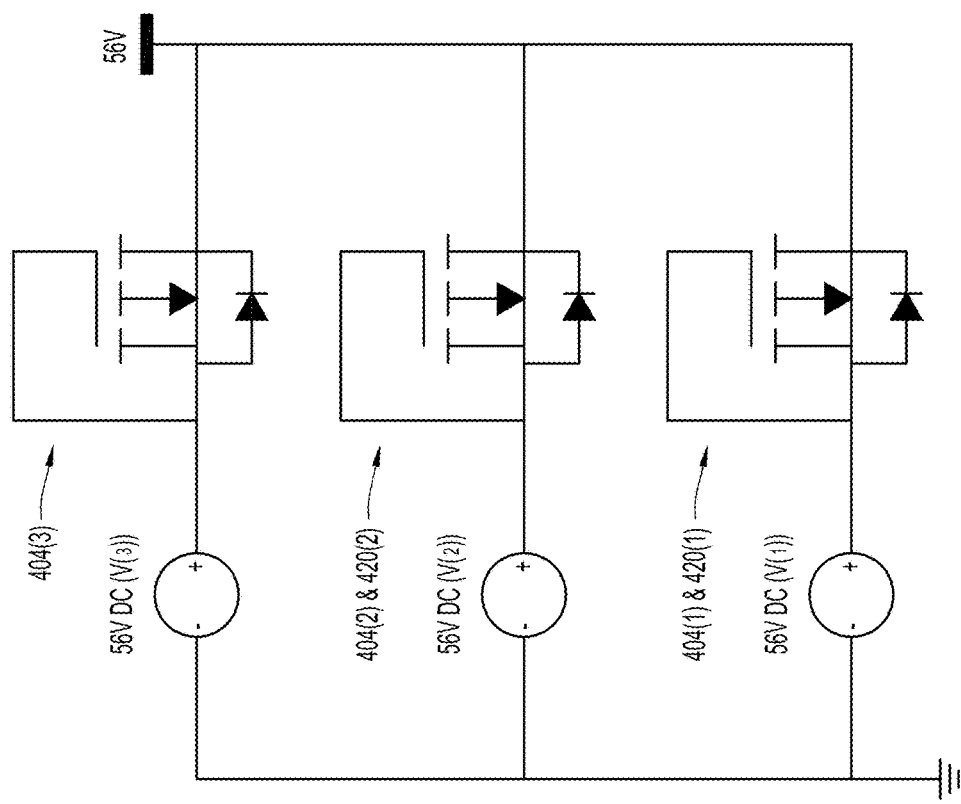
FIG. 7 is a system block diagram of an application of the power supply OR circuit shown in FIG. 4 for more than two power supplies, according to an example embodiment.

FIG. 7 illustrates a system application of the power supply OR circuit of FIG. 4, using 56V power voltages. Each of the three diode-connected PMOSFETs depicted in FIG. 7 represents a corresponding combined power supply switch (e.g., 404(i)) and control module (e.g., 420(i)) depicted in FIG. 4. The system of FIG. 7 operates as follows. The active PMOSFET OR circuit passes 56V from the highest priority available power supply. If higher priority power supplies are available, it will disable the lower priority power supplies' power PMOSFET, thereby disconnecting them from the load.

In summary, embodiments presented herein uses a low loss body diode of a PMOSFET to replace a conventional Schottky diode in a power supply OR circuit. A master power supply is selected to disable slave power supplies in order to avoid dual power supply metastability issues. Again, an inexpensive high efficiency PMOSFET with an analog controller is used to replace a low efficiency Schottky diode or an expensive NMOSFET with a digital controller for a diode OR circuit. Additional minor components ensure that only a single power supply drives the load preventing damage to the power supplies or the circuit while enhancing the master power supply's efficiency. Consequently, this design consumes less power with a lower cost than other typical efficient power supply OR solutions Advantages of this solution include reduced price, improved power efficiency, improved thermal efficiency and sourcing flexibility than what is available on the market.

The cost savings is an advantage and is especially useful for high volume power constrained devices like battery powered Internet of Things (IoT) devices. A typical NMOSFET with a digital controller may cost four times as much as a PMOSFET with an analog controller.

The increased efficiency is valuable to ensure a product with a constrained power source maximizes the available power of the source. For 60 W or 90 W PoE devices a significant amount of power is wasted in distribution and conversion without performing useful work. This problem has forced the industry to develop additional efficiency solutions like an active MOSFET bridge and LLC converters demonstrating a market necessity for power saving solutions for PoE. Additionally, an IEEE 802.3af device has only 13 W available. A 13.3 W wireless access point would need to be classified as a 25.5 W IEEE 802.3at device. Most switches will allocate the maximum potential 25.5 W instead of the necessary 13.3 W leaving the remaining 12.2 W unavailable for other PoE ports on the switch. Also some customers have not upgraded their infrastructure to IEEE 802.3at or newer standards. As a result, this solution can extend the longevity of capital expenditures by enabling products on the power consumption margin to meet the power limits of their current infrastructure. In addition, the charge for battery operated devices is precious. The increased efficiency extends the operating time of the device between charges.

Another problem related to power consumption is thermal safety. Many wireless access points cannot have fans or vent holes. All the power dissipated in the system needs to be transferred to the environment using convection and conduction only. Both forms of thermal flow are proportional to the cross sectional area of the product. As a result, the amount of power dissipated in the product determines the size of the product. Saving power using the embodiments presented herein directly translates to smaller products that meet safety requirements.

Smaller products translate to further cost savings from reduced material costs, as well as, reduced shipping costs. Smaller products also result in visual market differentiation. Small aesthetic products are a validated market advantage.

The simplicity of the embodiments presented herein utilize commodity analog components. Each component can be sourced using a dozen or more suppliers. The result is a supply chain robust solution that avoids vendor lock-in with a proprietary digital NMOSFET controller. Consequently, the embodiments avoid supply chain disruption that often result from unavoidable events like typhoons and earthquakes by easily working with parts from unaffected vendors. Lastly, using commodity components yields greater negotiating leverage with suppliers since there are multiple solutions to achieve the same result.

To reiterate, the analog active PMOSFET solution offers a cost, power efficiency, thermal efficiency, product size reduction, and sourcing flexibility advantage as compared to the alternate solutions.

The primary use case is for power constrained applications like batteries and PoE. Noteworthy battery applications include mobile phones, smart watches, laptops and IoT devices. Common PoE applications include wireless access points, IP telephony and security cameras. The embodiments presented herein are useful to reduce the system power consumption or battery drain by efficiently managing multiple power sources. By reducing the system power, the product size and cost can correspondingly be reduced.

In summary, in one form, an apparatus is provided, comprising: a first power supply switch including a power P-channel Metal Oxide Semiconductor Field Effect Transistor (PMOSFET) having a drain coupled to a first power rail to receive a first power voltage, a source coupled to an output node to power a load, and a gate to receive a gate voltage to selectively turn on or turn off the power PMOSFET to supply the first power voltage to the output node or isolate the first power rail from the output node, respectively; a second power supply switch coupled to a second power rail to receive a second power voltage and to pass to the output node the second power voltage when present; and a control circuit coupled to the second power rail and the gate, and that cooperates with the first power supply switch to control the gate voltage to (i) turn on the power PMOSFET if the first power voltage is present and the second power voltage is absent, and (ii) turn off the power PMOSFET if the second power voltage is present.

In another form, another apparatus is provided, comprising: multiple power supply switches each including a respective power PMOSFET having a source coupled to a common output to power a load, a drain to receive a respective one of multiple power voltages ranked incrementally from a lowest priority to a highest priority, and a gate to receive a respective gate voltage to turn on or turn off the power PMOSFET to supply the respective power voltage to the common output node or block the power voltage from the common output node, respectively; and multiple control modules each coupled to, and configured to control, a respective one of the power PMOSFETs, each control module to receive all of the power voltages having higher priorities than the power voltage received at the respective power PMOSFET controlled by that control module, each control module to control the gate voltage of the respective power PMOSFET to turn off the respective power PMOSFET if any of the higher priority power voltages are present, or permit the respective power PMOSFET to turn on responsive to the respective power voltage if all of the higher priority power voltages are absent.

In another form, yet another apparatus is provided, comprising: a first power supply switch including a power PMOSFET having a first drain coupled to a first power rail to receive a first power voltage, a first source coupled to an output node to power a load, and a first gate; a second power supply switch coupled to the output node and a second power rail to receive a second power voltage, the second power supply switch to provide to the output node the second power voltage when present; and a control circuit including: a signal PMOSFET having a source-drain (SD) path coupled between the second power rail and the first gate, and a second gate; and a first voltage divider having first and second series-connected resistors respectively coupled between the second power rail and the second gate and the second gate and a ground rail.

The above description is intended by way of example only.

What is claimed is:

1. An apparatus comprising:
a first power supply switch including a power P-channel Metal Oxide Semiconductor Field Effect Transistor (PMOSFET) having a drain coupled to a first power rail to receive a first power voltage, a source coupled to an output node to power a load, and a gate to receive a gate voltage to selectively turn on or turn off the power PMOSFET to supply the first power voltage to the output node or isolate the first power rail from the output node, respectively;
a second power supply switch coupled to a second power rail to receive a second power voltage and to pass to the output node the second power voltage when present; and
a control circuit coupled to the second power rail and the gate, and that cooperates with the first power supply switch to control the gate voltage to (i) turn on the power PMOSFET if the first power voltage is present and the second power voltage is absent, and (ii) turn off the power PMOSFET if the second power voltage is present.

2. The apparatus of claim 1, wherein:
the first power supply switch is configured to drive the gate voltage to a first voltage level to turn on the power PMOSFET if the first power voltage is present and the second power voltage is absent; and
the control circuit is configured to drive the gate voltage to a second voltage level to turn off the power PMOSFET if the second power voltage is present.

3. The apparatus of claim 2, wherein:
the first voltage level creates a negative gate-source voltage of the power PMOSFET to cause the power PMOSFET to operate in a fully on saturation region; and
the second voltage level creates a gate-source voltage of the power PMOSFET to cause the power PMOSFET to operate in a fully off cut-off region.

4. The apparatus of claim 2, wherein the control circuit includes a signal PMOSFET having a source-drain (SD) path coupled between the second power rail and the gate of the power PMOSFET, and a second gate to receive a second gate voltage to turn on the SD path if the second power voltage is present, wherein the SD path, when turned on responsive to the second power voltage, passes the second power voltage to the gate of the power PMOSFET as the second voltage level to turn off the power PMOSFET.

5. The apparatus of claim 4, wherein the control circuit further includes a voltage divider having first and second series-connected resistors respectively coupled between the second power rail and the second gate and the second gate and a ground rail, wherein the voltage divider is configured to control the second gate voltage to turn on the SD path if the second power voltage is present.

6. The apparatus of claim 4, wherein a source-drain path of the power PMOSFET is wider than the source-drain path of the signal PMOSFET when the power and signal PMOSFETS respectfully operate in fully-on saturated regions.

7. The apparatus of claim 2, wherein the first power supply switch includes a voltage divider having first and second series-connected resistors respectively coupled between the first power rail and the gate and the gate and a ground rail, wherein the voltage divider is configured to drive the gate voltage to the first voltage level to turn on the power PMOSFET if the first power voltage is present and the second power voltage is absent.

8. The apparatus of claim 7, wherein the control circuit includes a signal PMOSFET having a source-drain (SD) path coupled between the second power rail and the power PMOSFET gate, and a second gate to receive a second gate voltage to turn on the SD path if the second power voltage is present, wherein the SD path, when turned on responsive to the second power voltage, provides the second power voltage to the gate as the second voltage level to turn off the power PMOSFET.

9. The apparatus of claim 1, wherein the power PMOSFET includes an internal body diode configured to forward conduct in a direction from the drain to the source of the power PMOSFET.

10. An apparatus comprising:
a first power supply switch including a power P-channel Metal Oxide Semiconductor Field Effect Transistor (PMOSFET) having a first drain coupled to a first power rail to receive a first power voltage, a first source coupled to an output node to power a load, and a first gate;
a second power supply switch coupled to the output node and a second power rail to receive a second power voltage, the second power supply switch to provide to the output node the second power voltage when present; and
a control circuit including:
a signal PMOSFET having a source-drain (SD) path coupled between the second power rail and the first gate, and a second gate; and
a first voltage divider having first and second series-connected resistors respectively coupled between the second power rail and the second gate and the second gate and a ground rail.

11. The apparatus of claim 10, wherein the first power supply switch further includes:
a second voltage divider having third and fourth series-connected resistors respectively coupled between the first power rail and the first gate and the first gate and the ground rail.

12. The apparatus of claim 11, wherein:
the second voltage divider is configured to drive a gate voltage at the first gate to a first voltage level to turn on the power PMOSFET if the first power voltage is present and the second power voltage is absent; and
the signal PMOSFET is configured to drive the gate voltage to a second voltage level to turn off the power PMOSFET if the second power voltage is present.

13. The apparatus of claim 12, wherein a source-drain path of the power PMOSFET is wider than the source-drain path of the signal PMOSFET when the power and signal PMOSFETS respectfully operate in fully-on saturated regions.

14. The apparatus of claim 12, wherein:
the first voltage level creates a negative gate-source voltage of the power PMOSFET to cause the power PMOSFET to operate in a fully on saturation region; and
the second voltage level creates a gate-source voltage of the power PMOSFET to cause the power PMOSFET to operate in a fully off cut-off region.

15. The apparatus of claim 12, wherein the first voltage divider is configured to control a second gate voltage applied to the second gate of the signal PMOSFET to turn on the SD path of the signal PMOSFET if the second power voltage is present, wherein the SD path, when turned on responsive to the second power voltage, passes the second power voltage to the gate of the power PMOSFET as the second voltage level to turn off the power PMOSFET.

16. The apparatus of claim 10, wherein the power PMOSFET includes an internal body diode configured to forward conduct in a direction from the drain to the source of the power PMOSFET.

17. The apparatus of claim 10, wherein:
the first power supply switch is configured to drive a first gate voltage of the first gate to a first voltage level to turn on the power PMOSFET if the first power voltage is present and the second power voltage is absent; and
the control circuit is configured to drive the first gate voltage of the first gate to a second voltage level to turn off the power PMOSFET if the second power voltage is present.

* * * * *